United States Patent
Kim et al.

(10) Patent No.: US 12,106,979 B2
(45) Date of Patent: Oct. 1, 2024

(54) APPARATUS AND METHOD FOR CONTROLLING TEMPERATURE UNIFORMITY OF SUBSTRATE

(71) Applicant: UNIVERSITY-INDUSTRY COOPERATION GROUP OF KYUNG HEE UNIVERSITY, Yongin-si (KR)

(72) Inventors: Jin Gyun Kim, Suwon-si (KR); Chang Uk Ahn, Suwon-si (KR); Ji Won Lee, Jeonju-si (KR); In Chan Beck, Suwon-si (KR); Do Hyeong Kwon, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 323 days.

(21) Appl. No.: 17/670,060

(22) Filed: Feb. 11, 2022

(65) Prior Publication Data
US 2022/0399214 A1 Dec. 15, 2022

(30) Foreign Application Priority Data
Jun. 10, 2021 (KR) .................. 10-2021-0075550

(51) Int. Cl.
*H05B 3/00* (2006.01)
*H01L 21/67* (2006.01)

(52) U.S. Cl.
CPC .. *H01L 21/67115* (2013.01); *H01L 21/67248* (2013.01); *H05B 3/00* (2013.01)

(58) Field of Classification Search
CPC ............... H05B 3/00; H01L 21/67115; H01L 21/67248
See application file for complete search history.

(56) References Cited

U.S. PATENT DOCUMENTS

2008/0017315 A1* 1/2008 Fukuchi ............ H01J 37/32357
                                                           118/712
2012/0064472 A1 3/2012 Yoshii et al.
(Continued)

FOREIGN PATENT DOCUMENTS

JP      11-329993 A    11/1999
JP     2010-054109 A    3/2010
(Continued)

OTHER PUBLICATIONS

Office Action received for Korean Patent Application No. 10-2021-0075550, mailed on Mar. 2, 2023, 13 pages (7 pages of English Translation and 6 pages of Original Document).

*Primary Examiner* — Nael N Babaa
(74) *Attorney, Agent, or Firm* — WOMBLE BOND DICKINSON (US) LLP

(57) ABSTRACT

An apparatus for controlling temperature uniformity of the disclosure includes a heater to supply a heat source to a substrate, a temperature sensor to generate temperature data of the substrate, a heating controller to present a distribution of a heat source based on the temperature data, and a heat source-electricity converter to calculate an amount of electricity to generate a heat source based on the distribution of a heat source and to supply the calculated amount of electricity to the heater. Since a method and an apparatus of the disclosure for controlling temperature uniformity uses a heat source and electricity having a linear relationship, problems of high costs and deterioration of an apparatus may be overcome that a typical method has to control an amount of electricity in a heater by temperature information.

11 Claims, 3 Drawing Sheets

(56) References Cited

U.S. PATENT DOCUMENTS

2016/0300816 A1* 10/2016 Park .................... H01L 25/0657
2018/0148835 A1* 5/2018 Erickson ............... C23C 16/463

FOREIGN PATENT DOCUMENTS

| JP | 2012-080081 A | 4/2012 |
| JP | 2019-192865 A | 10/2019 |
| KR | 10-2009-0042874 A | 4/2009 |
| KR | 10-2010-0017948 A | 2/2010 |
| KR | 10-2011-0086793 A | 8/2011 |

* cited by examiner

APPARATUS AND METHOD FOR CONTROLLING TEMPERATURE UNIFORMITY OF SUBSTRATE

CROSS-REFERENCE TO RELATED APPLICATION

This application claims the benefit under 35 U.S.C. § 119 of Korean Patent Application No. 10-2021-0075550 filed on Jun. 10, 2021, in the Korean Intellectual Property Office, the entire disclosure of which is incorporated herein by reference for all purposes.

BACKGROUND

1. Field

The following description relates to an apparatus and method for controlling a temperature of a wafer uniformly during a rapid thermal processing, more specifically, an apparatus and method for controlling a temperature uniformity highly precisely with a low cost by controlling an amount of electricity of a heater through converting measured temperature information into heat source information.

2. Description of Related Art

In manufacturing a semiconductor device, a temperature of a wafer rapidly increases in a rapid thermal processing (hereinafter, 'RTP'). In this case, when a temperature distribution of a wafer is not maintained uniformly, there may be problems such as a warpage, crack, and dislocation. Therefore, it is important to maintain a temperature distribution uniformly in a RTP operation, and a technical method is desired to precisely control a temperature distribution measurement of a wafer and a heating device accordingly.

Since a temperature and an electric power have a non-linear relationship, a technology is being developed to build a non-linear model with a learning algorithm (machine learning, deep learning, etc.) such as a data-driven modeling and to convert a temperature and an electric power through the algorithm. However, this method needs considerable costs to build an initial model. Further, in a data-driven modeling, there is a problem that it is impossible to reflect a model deviation that occurs due to a deterioration of an apparatus.

In Korean Patent Publication No. 10-2009-0042874 (Title: Supply power adjusting apparatus and semiconductor manufacturing apparatus, Applicant: Kabushiki geisha Sanco and the other), a method is disclosed to control an electric power by using a temperature in a semiconductor manufacturing apparatus to perform heat treatment. However, the publication No. 10-2009-0042874 also performs controlling an electricity based on a non-linear relationship between a temperature and an electricity, resulting in decline of accuracy.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an apparatus for controlling temperature uniformity in accordance with one or more embodiments of the disclosure may include a heater to supply a heat source to a substrate; a temperature sensor to generate temperature data of the substrate; a heating controller to present a distribution of a heat source based on the temperature data; and a heat source-electricity converter to calculate an amount of electricity to generate a heat source based on the distribution of a heat source and to supply the calculated amount of electricity to the heater.

The heat source-electricity converter may calculate the amount of electricity based on a loss of a thermal energy occurring in a heat transfer process from the heater to the substrate and the distribution of a heat source from the heating controller.

The heating controller may present the distribution of a heat source by using a numerical model of Formula 1, which will be described below.

The heat source-electricity converter may calculate the amount of electricity by inputting data of a distribution of a heat source input from the heating controller in a linear model of Formula 4, which will be described below.

The heat source-electricity converter may accumulate data of a measured temperature vector and an estimated temperature vector and correct a compensation coefficient when a least squares error that is calculated by accumulated data exceeds a predetermined range.

The heating controller may estimate an entire temperature distribution based on the temperature data, and may present the distribution of a heat source based on the entire temperature distribution.

Meanwhile, a method for controlling temperature uniformity in accordance with one or more embodiments of the disclosure may include a generating operation to generate temperature data of a substrate; a presenting operation to present a distribution of a heat source based on the temperature data; a calculating operation to calculate an amount of electricity to generate a heat source based on the distribution of a heat source; and a supplying operation to supply the calculated amount of electricity to a heater generating the heat source.

The calculating operation may calculate the amount of electricity based on a loss of a thermal energy occurring in a heat transfer process from the heater to the substrate and the distribution of a heat source from the heating controller.

The distribution of a heat source may be generated by using a numerical model of Formula 1, which will be described below.

The amount of electricity may be calculated by inputting data of the distribution of a heat source in a numerical model of Formula 4, which will be described below.

The method may further include an accumulating operation to accumulate data of a measured temperature vector and an estimated temperature vector; and a correcting operation to correct a compensation coefficient when a least squares error calculated by accumulated data exceeds a predetermined range.

The method may further include an estimating operation to estimate an entire temperature distribution of the substrate based on the temperature data, wherein the presenting operation to present the distribution of a heat source may generate the distribution of a heat source based on the estimated and entire temperature distribution.

The estimating operation may include a building operation to build a numerical model for a form and a thermal behavior of the substrate; a setting operation to set a regularization parameter to adjust noises of a measured temperature of the substrate; a generating operation to generate a sensitivity coefficient matrix that estimates a heat source received by the substrate from a plurality of heaters; a condensing operation to condense the sensitivity coefficient matrix based on a power ratio input in the heaters respectively; and an estimating operation to estimate an entire temperature distribution of the substrate based on the numerical model, the regularization parameter, and the condensed sensitivity coefficient matrix, when predetermined temperature data are input.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure may solve problems related to the above issue, and the objective of the disclosure is to provide an apparatus and a method for precisely controlling an electricity by converting temperature information into heat source information and controlling an amount of electricity of a heater.

To solve a problem of a typical technology using a non-linear control, the disclosure introduces an Inverse Heat Transfer Problem. An inverse problem is to find an input from an output, and it is mainly used in a signal processing, virtual sensor, system identification, machine learning, and medical imaging, etc. The disclosure may precisely control a temperature uniformity by calculating an amount of electricity input in a heating device based on output data measured by a temperature sensor.

Figure 1:
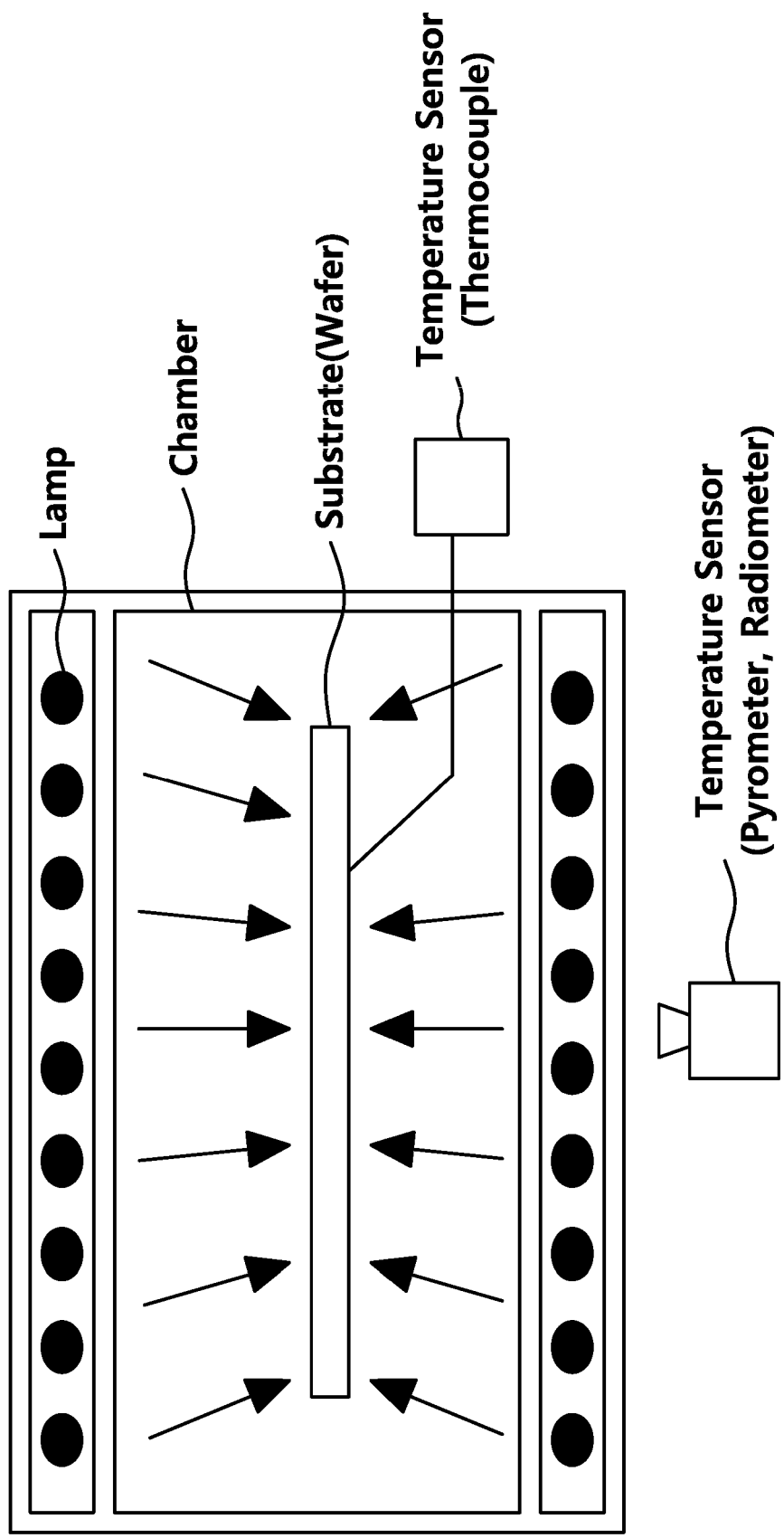
FIG. 1 is a schematic diagram of a rapid thermal processing apparatus for manufacturing a semiconductor device.

FIG. 1 is a schematic diagram of a rapid thermal processing apparatus for manufacturing a semiconductor device. As illustrated in FIG. 1, a RTP operation is conducted in a vacuum chamber (C). By using a halogen lamp or tungsten halogen lamp instead of a heater, an infrared radiant light is produced, and a laser beam is collected on a condensing lens and injected to a wafer in an instant. Compared with a thermal processing using a furnace, a RTP operation may perform a thermal processing of a wafer rapidly, and it is easy to control a process and a surrounding environment.

A temperature measurement is conducted by measuring a temperature inside a furnace in a thermal processing using a furnace. However, in a RTP operation, a temperature of a wafer surface is directly measured. In this case, as illustrated in FIG. 1, a contact temperature sensor, thermocouple or a non-contact temperature sensor, pyrometer, etc. may be used to measure a temperature of a wafer.

An apparatus for controlling temperature uniformity of the disclosure may include a heating controller to present a heat source in real time to heat a temperature of a wafer uniformly as time passes and a heat source-electricity converter to calculate an amount of electricity input in a heater to perform a heating based on the presented heat source.

In this case, the heat source-electricity converter may calculate the amount of electricity by building a numerical model. A relationship is non-linear between a temperature (° C.) and an electricity (W), while a relationship is linear between a heat source ($W/m^2$) and an electricity (W). Herein, since an area refers to an area of a wafer, which is a fixed constant, ratios of the two relationships may correspond to a dimensionless number. The disclosure may easily built a numerical model with using it.

To control an amount of electricity applied to a heater by heat source information, a loss of a thermal energy and a dispersion of a thermal energy that occur while a heat arrives at a wafer from a heater, and a loss of a heater itself need to be considered. Through that, a desired amount of heat may be applied to a wafer by applying an amount of electricity compensating the losses.

In the apparatus for controlling temperature uniformity of the disclosure, a dispersed amount of thermal energy of a heater may be considered in the heating controller, and a loss of a thermal energy may be compensated in the heat source-electricity converter.

Figure 2:
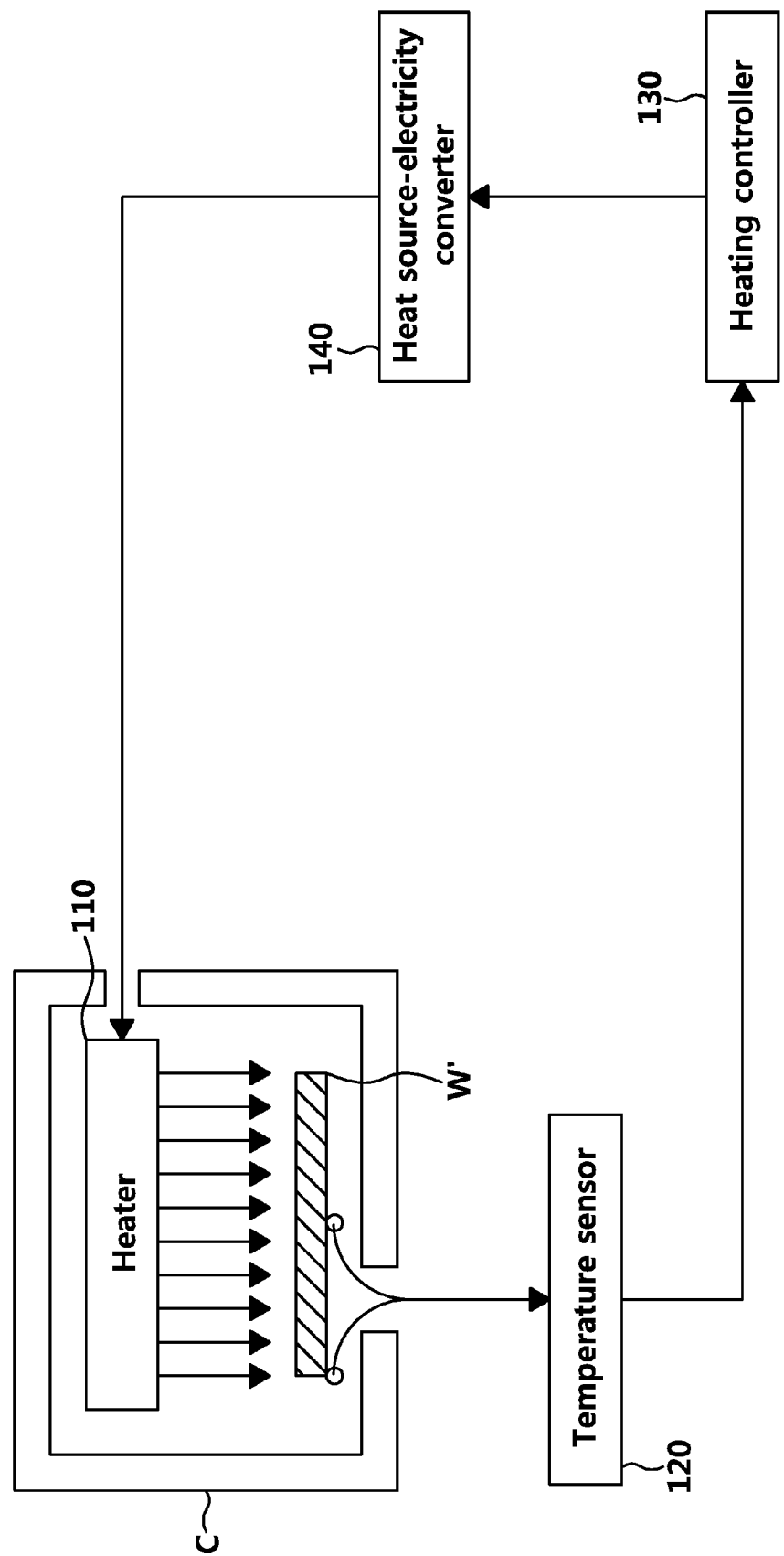
FIG. 2 is a block diagram to illustrate a configuration of an apparatus for controlling temperature uniformity in accordance with one or more embodiments of the disclosure.

FIG. 2 is a block diagram to illustrate a configuration of an apparatus for controlling temperature uniformity in accordance with one or more embodiments of the disclosure. As illustrated in FIG. 2, an apparatus for controlling temperature uniformity of the disclosure may include the heater 110, the temperature sensor 120, the heating controller 130, and the heat source-electricity converter 140.

The heater 110 may provide a substrate (W) inside the chamber (C) with a heat source, and the temperature sensor 120 may generate temperature data of the substrate (W). The heater 110 may be embodied as a various device such as a lamp, etc. to provide a heat source. The temperature sensor 120 may generate temperature data by measuring a temperature of the substrate (W) directly or indirectly. In this example, numbers of the heater 110 and the temperature sensor 120 may be configured variously as needed.

The heating controller 130 may present a distribution of a heat source based on the temperature data generated by the temperature sensor 120. Specifically, the distribution of a heat source may be presented by processing the measured temperature data with using a numerical model of Formula 1 below.

$$\Delta t = t^{i+1} - t^i$$

$$\Delta q^{i+1}[(X^{i+1})^T(X^{i+1}) + \alpha I]^{-1}(X^{i+1})^T(V^{i+1} - \overline{Y}^{i+1})$$

$$q^{i+1} = q^i + \Delta q^{i+1}$$

$$\hat{Y}^{i+1} = Y^i + X^{i+1}\Delta q^{i+1} \quad \text{Formula 1}$$

($t^i$: present time, $t^{i+1}$: future time, $\Delta t$: interval of measurement, $q^{i+1}$: future heat source vector for controlling, $V^{i+1}$: target temperature vector, $Y^i$: measured temperature vector, $\hat{Y}^{i+1}$: estimated temperature vector for future, $\overline{Y}^{i+1}$: virtual temperature vector when $Y^i$ is constantly heated by $q^i$, $\alpha$: parameter for adjusting stability against noises of measured temperature, $X^{i+1}$: sensitivity coefficient matrix)

Herein, the sensitivity coefficient matrix may be defined by Formula 2 below.

$$X^{i+1} = \frac{\partial Y^{i+1}}{\partial q} \quad \text{Formula 2}$$

To calculate the above Formula 1 and Formula 2, a wafer finite element model may be used. A finite element model may embody an element as the identical shape of a spatially disassembled heater. In one example, when a hundred of heaters 110 heat the substrate (W'), a modeling may be performed with 100 grid elements. Herein, when the number of nodes is 121, a vector of $Y^i$ should be 121, and a component of the vector may refer to a temperature of each node. $X^{i+1}$ may be determined by the finite element model and a dispersion distribution of a thermal energy.

The heating controller 130 may aim at heating a wafer uniformly. In one example, when desired temperatures of a wafer starting from $t^i$ with the interval of $\Delta t$ are 100° C., 300° C., and 450° C., a target temperature vector may be input as Formula 3 below.

$$V^{i+1} = [100, 100, \ldots, 100]^T$$

$$V^{i+2} = [300, 300, \ldots, 300]^T$$

$$V^{i+3} = [450, 450, \ldots, 450]^T \quad \text{Formula 3}$$

Ultimately, the heating controller 130 may deliver $q^{i+1}$, $q^{i+2}$, and $q^{i+3}$ to the heat source-electricity converter 140 in each time of $t^{i+1}$, $t^{i+2}$, and $t^{i+3}$.

The heat source-electricity converter 140 may calculate an amount of electricity to generate a heat source based on the distribution of a heat source and supply the calculated amount of electricity to the heater 110. That is, in order that the substrate (W') receives a heat source as much as $q^{i+1}$ calculated by the heating controller 130, the heat source-electricity converter 140 may calculate an amount of electricity that is desired to be applied to the heater 110. An amount of electricity (W) is calculated by multiplying $q^{i+1}$ (W/m²) by an area (m²) of the substrate (W'). However, when the calculated value is input in the heater 110, there may be an error due to a loss (W) of the heater 110 itself and a loss of a thermal energy (W) that occurs while a heat arrives at the substrate (W') from the heater.

Considering the above-mentioned error, the heat source-electricity converter 140 may deliver an amount of electricity compensating the error to the heater 110. A numerical model of Formula 4 below is used to compensate an error.

$$\begin{bmatrix} A_1 q_1^{i+1} \\ A_2 q_2^{i+1} \\ \vdots \\ A_M q_M^{i+1} \end{bmatrix} = \begin{bmatrix} \lambda_1 Q_1^{i+1} \\ \lambda_2 Q_2^{i+1} \\ \vdots \\ \lambda_M Q_M^{i+1} \end{bmatrix} \quad \text{Formula 4}$$

Herein, M refers to the number of heaters. $A_i$ (i=1, ..., M) refers to a heated area of each heater, $Q_i$ (i=1, ..., M) refers to an amount of electricity input in a heater, and $\lambda_i$ (i=1, ..., M) refers to a compensation coefficient. A compensation coefficient changes according to a heating condition (performance of a chamber, heating distance, type of a heater, etc.). When a high precision is desired, a shape function of a finite element model may be corrected with a compensation coefficient.

Since a compensation coefficient $\lambda_i$ changes according to a heating condition, when a heating condition slightly changes based on a deterioration of an apparatus, an appropriate performance is not guaranteed. To prevent this circumstance, the heat source-electricity converter 140 may accumulate the measured temperature vector $Y^i$ and the estimated temperature vector $\hat{Y}^i$, calculate a least square error with accumulated data, and correct the compensation coefficient $\lambda_i$ through scaling with making a time a maintenance time when an error occurs above a predetermined allowance.

Meanwhile, regarding the above description for Formula 1, the entire temperature distribution is desired to be reflected in a measured temperature. In this case, the disclosure may use a method to estimate the entire temperature distribution based on a measured temperature. The description below relates to the case.

A method to estimate the entire temperature distribution based on a measured temperature may include ① a building operation to build a numerical model, ② a setting operation to set a regularization parameter, ③ a generating operation to generate a sensitivity coefficient matrix to estimate a heat source, ④ a condensing operation to condense a sensitivity coefficient matrix based on a power ratio, and ⑤ an estimating operation to estimate the entire temperature distribution by inputting temperature data.

First, a heat source and the entire temperature distribution may be calculated by Formula 5 below.

$$\Delta t = t^{i+1} - t^i$$

$$\Delta q^{i+1}[(X_s^{i+1})^T(X_s^{i+1}) + \alpha I]^{-1}(X_s^{i+1})^T(Y^{i+1} - \overline{T}_s^{i+1})$$

$$q^{i+1} = q^i + \Delta q^{i+1}$$

$$T^{i+1} = T^i + X^{i+1}\Delta q^{i+1} \quad \text{Formula 5}$$

Herein, $t^i$ refers to a past time, $t^{i+1}$ refers to a present time, $\Delta t$ refers to an interval of measurement, $q^{i+1}$ refers to an estimated heat source vector, $Y^{i+1}$ refers to a measured temperature vector, and $T^{i+1}$ refers to an estimated entire temperature vector, including temperatures of other points where there is no temperature sensor. Additionally, $\overline{T}_s^{i+1}$ refers to a virtual temperature vector of a point having a temperature sensor when $T_s^i$ is consistently heated by $q^i$, and it becomes a constant when there is one temperature sensor. $X_s^{i+1}$ is a sensitivity coefficient matrix of a sensor location, and it is defined by Formula 6 below.

$$X_s^{i+1} = \frac{\partial T_s^{i+1}}{\partial q} = \begin{bmatrix} \frac{\partial T_1^{i+1}}{\partial q_1} & \frac{\partial T_1^{i+1}}{\partial q_2} & \cdots & \frac{\partial T_1^{i+1}}{\partial q_M} \\ \frac{\partial T_2^{i+1}}{\partial q_1} & \frac{\partial T_2^{i+1}}{\partial q_2} & \cdots & \frac{\partial T_2^{i+1}}{\partial q_M} \\ \vdots & \vdots & \ddots & \vdots \\ \frac{\partial T_N^{i+1}}{\partial q_1} & \frac{\partial T_N^{i+1}}{\partial q_2} & \cdots & \frac{\partial T_N^{i+1}}{\partial q_M} \end{bmatrix}$$ Formula 6

Herein, N corresponds to the number of respectively used sensors, and M corresponds to the number of spatially disassembled heaters. In one example, when 3 sensors and 100 heaters are used, $X_s^{i+1}$ is a matrix of 3×100. $X^{i+1}$ is defined in the same way, and the number of columns is identically M, but the number of rows is identical with the entire degree of freedom of a numerical model, which will be described later. For example, when a degree of freedom of a numerical model in a wafer is 100 that is built in the building operation of a numerical model, $X^{i+1}$ is a matrix of 100×100.

Descriptions of each operation for a method to estimate the entire temperature distribution based on a measured temperature are given below.

① A Building Operation to Build a Numerical Model

A heat transfer model to express a thermal behavior of a wafer is desired to be built, and in the building operation to build a numerical model, a numerical model may be built for a form and thermal behavior of a substrate. Since a wafer processed by a RTP operation is usually a thin film, 2D numerical model building may be appropriate, but it is not limited thereto.

Various technology such as a finite element method, finite difference method, and boundary element method, etc. may be used to build a numerical model.

A numerical analysis method conducts a modeling mathematically for a law and a condition that dominates a phenomenon, expresses a solution in a combination of interpolation functions to obtain an approximate solution, and calculates each basis function. In this case, a mathematical illustration is generally converted into a matrix equation to calculate a coefficient of a basis function. A type of a numerical analysis method may be determined based on a method to define a basis function.

In one example, to define a basis function systematically, a finite element method may perform a numerical analysis by dividing a spatial region of a target object, that is, a wafer, into small regions called finite elements.

A finite difference method performs a numerical integration for a differential equation inside a geometric region that is a target of a natural phenomenon to induce a matrix equation. Finite dots generated inside a geometric region are called grids, and an accuracy of an approximate solution is improved according to a density of grids.

A boundary element method performs integral calculation to a multiple of a differential equation by a kernel function called a green function for the entire region of a target object. After that, according to a green theorem, an integration for the entire region is converted into a boundary integral format based on a boundary of an object. A numerical analysis is conducted by applying a boundary condition.

The building operation to build a numerical model may use various numerical analysis methods except for the above-identified methods, and the disclosure is not limited by a specific numerical analysis method.

② A Setting Operation to Set a Regularization Parameter

The setting operation to set a regularization parameter may set a regularization parameter to adjust noises of a temperature of the substrate measured by a temperature sensor. In the above Formula 5, $\alpha$ is a parameter to improve a stability. A regularization parameter may be desired to guarantee a stability against noises of a temperature sensor used in a system. That is, $\alpha$ value, a regularization parameter, may be determined by the number of sensors, their location, a thermal diffusivity of a wafer, and a performance of a chamber. Since the value may play a role to suppress an instability for a measurement error by giving a penalty, an appropriate value is desired to be input.

A method to set $\alpha$ value is as follows. ① collecting temperature information based on time of a wafer that is processed for one cycle when manufacturing an initial apparatus, ② converting the collected temperature into filtering data with removed noises by filtering the temperature through a post-processing, and ③ determining $\alpha$ value that makes the filtering data and a least square error minimum by changing $\alpha$ in the above Formula 5.

Since $\alpha$ is determined by performances of a sensor and a chamber, preparing a deterioration of an apparatus is desired because measured noise increases as an apparatus is deteriorated. Therefore, when an apparatus is being operated, temperature data (information) of a certain cycle may be collected in a memory of a calculation device, and an amount of increased noise may be observed. In this case, the amount of increased noise may be observed by using a method such as a generalized cross validation, etc., and correcting $\alpha$ value may be performed with the method based on the amount of increased noise. By an automatic correction of a regularization, anyone may use, maintain, and manage an apparatus easily. Shortly, an automatic correction method of a regularization is as follows: ⓐ setting the first regularization parameter based on temperature data during the first test operation, ⓑ calculating a correction value of a regularization parameter in a predetermined cycle based on temperature data saved in a memory during a thermal processing, and ⓒ setting the correction value as the regularization parameter.

③ A Generating Operation to Generate a Sensitivity Coefficient Matrix

The generating operation to generate a sensitivity coefficient matrix may estimate a heat source received by the substrate from a plurality of heaters. In generating operation to generate a sensitivity coefficient matrix, $X^{i+1}$ and $X_s^{i+1}$ of the above Formula 6 are received. $X_s^{i+1}$ is used to calculate a heat source that arrives at a wafer from a heater, and the entire temperature distribution may be estimated with the calculated heat source and $X^{i+1}$.

To make sure that the estimated entire temperature distribution is the only one, numbers of columns and rows of $X_s^{i+1}$ are identical, or the number of rows is larger than the number of columns. That indicates the number of sensors should be larger than the number of heaters. Since spatially disassembled heaters are generally more than sensors, a method to guarantee the above-identified condition is desired. Otherwise, it becomes mathematically ill-posed problem, and there may be several solutions, not only one. This problem may be solved by a condensing operation below.

④ A Condensing Operation to Condense a Sensitivity Coefficient Matrix Based on a Power Ratio The condensing operation to condense a sensitivity coefficient matrix may condense a sensitivity coefficient matrix based on power ratio information respectively input in each heater. With using the power ratio input in each heater, the above Formula 6 may be rewritten in Formula 7 below.

$$X_s^{i+1} = [X_{s1}^{i+1} X_{s2}^{i+1} \ldots X_{sM}^{i+1}]$$

$$\tilde{X}_s^{i+1} = \frac{q_1}{q_1}X_{s1}^{i+1} + \frac{q_2}{q_1}X_{s2}^{i+1} + \ldots + \frac{q_M}{q_1}X_{sM}^{i+1}$$

Formula 7

Herein, $\tilde{X}_s^{i+1}$ refers to a sensitivity coefficient matrix vector condensed with using a power ratio. In one example, it becomes 3×1 vector when using 3 sensors. Since the number of rows is larger than the number of columns, the only one solution may be guaranteed, and the problem mentioned above may be solved accordingly. A heat source of the first heater is only calculated in Formula 7, but other heat sources of the rest of heaters may be restored by using a power ratio. That is, through a condensing configuration of the sensitivity coefficient matrix, the disclosure may restore multiple heat sources only with small temperature data obtained from only one temperature sensor.

Therefore, the condensing operation to condense the sensitivity coefficient matrix may include an operation to calculate power ratio information of each heater. Based on the calculated power ratio information, the condensed sensitivity coefficient matrix may be drawn as above, ⑤ An Estimating Operation to Estimate the Entire Temperature Distribution The estimating operation to estimate the entire temperature distribution may estimate the entire temperature distribution of a substrate based on the numerical model, the regularization parameter, and the condensed sensitivity coefficient matrix, when predetermined temperature data are input. Specifically, some of heat sources may be only calculated among a plurality of heaters, and the rest of heat sources may be restored based on the condensed sensitivity coefficient matrix. Accordingly, the entire temperature distribution may be obtained.

The method related to estimation of the entire temperature distribution based on a measured temperature is merely an embodiment, and it is possible to estimate the entire temperature distribution with another method.

Figure 3:
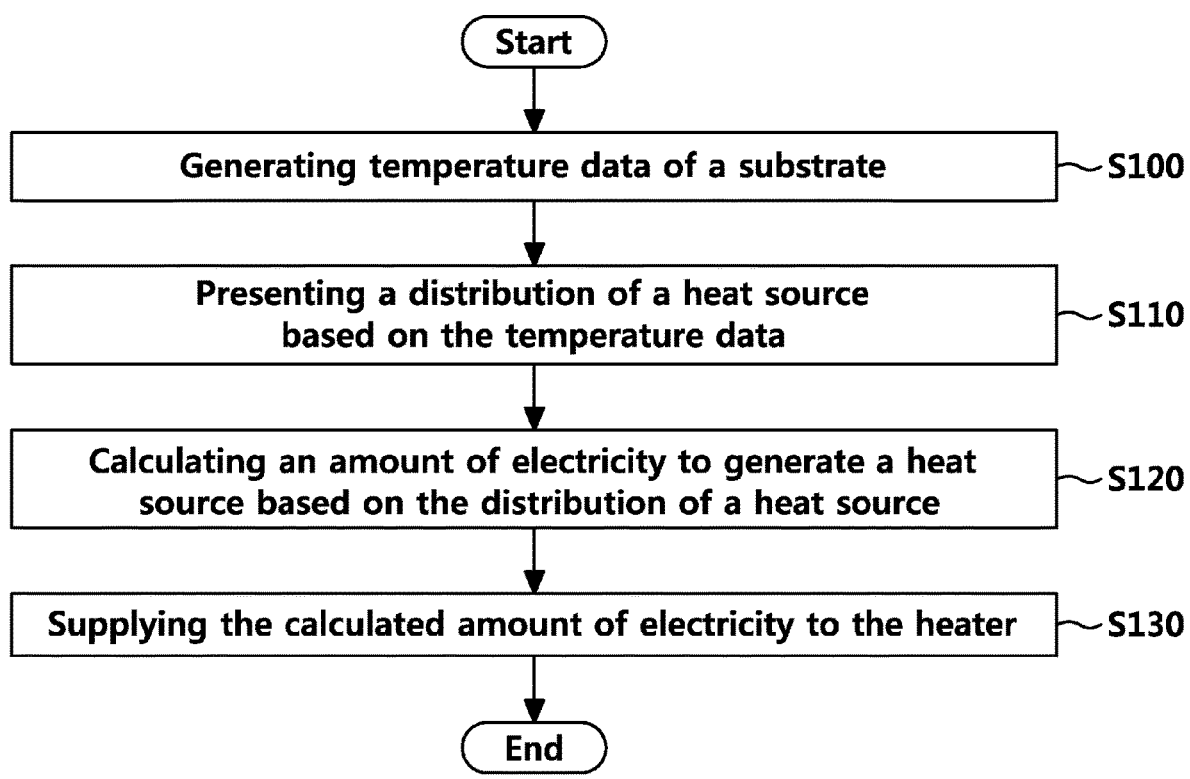
FIG. 3 is a flow chart of a method for controlling temperature uniformity in accordance with one or more embodiments of the disclosure.

FIG. 3 is a flow chart of a method for controlling temperature uniformity in accordance with one or more embodiments of the disclosure. As illustrated in FIG. 3, first of all, temperature data of a substrate are generated (S100). A distribution of a heat source is presented based on the temperature data (S110). The temperature data may be measured by a temperature sensor. The entire temperature distribution is desired to be reflected in a measured temperature, and in this case, a measured temperature may be converted into the entire temperature distribution through the above-mentioned method to estimate the entire temperature distribution and may be used as data. The presenting operation to present a distribution of a heat source corresponds to a function and an operation of the heating controller 130, and therefore, a detailed description is omitted.

After that, an amount of electricity is calculated to generate a heat source based on a distribution of a heat source (S120). The calculating operation to calculate an amount of electricity (S120) may calculate the amount of electricity based on a loss of a thermal energy generated in a heat transfer process from the heater to the substrate and the distribution of a heat source delivered from the heating controller. The calculating operation to calculate an amount of electricity (S120) corresponds to a function and an operation of the heat source-electricity converter 140, and therefore, a detailed description is omitted.

Lastly, the calculated amount of electricity is supplied to the heater (S130). Since the heater supplies a heat source with the calculated amount of electricity to adjust a temperature uniformity of the substrate, it may be possible to control a temperature uniformity of the substrate precisely.

Meanwhile, a method for controlling temperature uniformity in accordance with one or more embodiments of the disclosure may further include an accumulating operation to accumulate measured temperature vector data and estimated temperature vector data and a correcting operation to correct a compensation coefficient by using the accumulated data.

Specifically, a maintenance time may be determined when a least squares error calculated by accumulated, measured temperature vector data and estimated temperature vector data exceeds a predetermined range. When the time comes, by correcting a compensation coefficient, an error may be prevented in advance due to deterioration of the heater 100 and the chamber (C).

Additionally, temperature data used in presenting a distribution of a heat source may be desired to be the entire temperature distribution. It is possible to obtain the entire temperature distribution by using numerous sensors, but it may be difficult to use the entire temperature distribution when using a few temperature sensors. For that, a method for controlling temperature uniformity of the disclosure may further include an estimating operation to estimate the entire temperature distribution of a substrate based on temperature data.

An estimating operation to estimate the entire temperature distribution of a substrate may include a building operation to build a numerical model for a form and a thermal behavior of the substrate, a setting operation to set a regularization parameter to adjust noises of a measured temperature of the substrate, a generating operation to generate a sensitivity coefficient matrix that estimates a heat source received by the substrate from a plurality of heaters, a condensing operation to condense the sensitivity coefficient matrix based on a power ratio input in the heaters respectively, and an estimating operation to estimate the entire temperature distribution of the substrate based on the numerical model, the regularization parameter, and the condensed sensitivity coefficient matrix, when predetermined temperature data are input. The related descriptions are given above, and therefore, a repeated description is omitted.

According to the above method to estimate the entire temperature distribution, the entire temperature distribution may be estimated based on the numerical model, the regularization parameter, and the condensed sensitivity coefficient matrix, when temperature data of a few sensors are input, without numerous sensors. That is, by calculating some of heat sources among a plurality of heaters and restoring the rest of heat sources based on the condensed sensitivity coefficient matrix, it may be possible to obtain the entire temperature distribution.

Meanwhile, a method for controlling temperature uniformity may be embodied on a computer system. A system composed of one or more computers may be configured to perform each operation of the above-identified method by setting up a software, firmware, hardware, or their combination in a system that makes a system perform operations during working. When one or more computer programs are executed by a data processor, the program may be configured to perform specific operations by including commands that makes a device perform operations.

Meanwhile, the above-identified method for controlling temperature uniformity may be embodied as a program command that may be executed through various computer means and recorded in a computer readable medium. The computer readable medium may include a program command, data file, data structure, etc., or their combination. The program command recorded in the medium may be specifically configured and designed for the disclosure, or it may be one that is notified and usable to an operator of computer software. Examples of the computer readable medium include a magnetic media such as a hard disk, floppy disk, and a magnetic disk, an optical media such as CD-ROM and DVD, a magneto-optical media such as a floptical disk, and a hardware device such as ROM, RAM, and flash memory, etc. that is specifically configured to save and execute a program command. Examples of the program command may include not only a machine language code made by a complier, but also a high-level language code that may be executed by a computer with using an interpreter, etc. The above-identified hardware device may be configured to be operated as one or more software modules to perform an operation of the disclosure, and a reversed situation may be also possible.

Since a method and an apparatus of the disclosure for controlling temperature uniformity uses a heat source and electricity having a linear relationship, problems of high costs and deterioration of an apparatus may be overcome that a typical method has to control an amount of electricity of a heater by temperature information. Specifically, by equipping a linear controller, the disclosure may reduce costs considerably compared with a typical method having a non-linear controller. Additionally, a technical effect to reduce a maintenance cost may be obtained because an error due to a deterioration of an apparatus may be easily corrected by changing a parameter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for controlling temperature uniformity, comprising:
    a heater to supply a heat source to a substrate;
    a temperature sensor to generate temperature data of the substrate;
    a heating controller to present a distribution of a heat source based on the temperature data; and
    a heat source-electricity converter to calculate an amount of electricity to generate a heat source based on the distribution of a heat source and to supply the calculated amount of electricity to the heater,
    wherein the heat source-electricity converter calculates the amount of electricity based on a loss of a thermal energy occurring in a heat transfer process from the heater to the substrate and the distribution of a heat source from the heating controller.

2. The apparatus for controlling temperature uniformity of claim 1,
    wherein the heating controller presents the distribution of a heat source by using a numerical model below.

$$\Delta t = t^{i+1} - t^i$$

$$\Delta q^{i+1} [(X^{i+1})^T (X^{i+1}) + \alpha I]^{-1} (X^{i+1})^T (V^{i+1} - \overline{Y}^{i+1})$$

$$q^{i+1} = q^i + \Delta q^{i+1}$$

$$\hat{Y}^{i+1} = Y^i + X^{i+1} \Delta q^{i+1}$$

($t^i$: present time, $t^{i+1}$: future time, $\Delta t$: interval of measurement, $q^{i+1}$: future heat source vector for controlling, $V^{i+1}$: target temperature vector, $Y^i$: measured temperature vector, $\hat{Y}^{i+1}$: estimated temperature vector for future, $\overline{Y}^{i+1}$: virtual temperature vector when $Y^i$ is constantly heated by $q^i$, $\alpha$: parameter for adjusting stability against noises of measured temperature, $X^{i+1}$: sensitivity coefficient matrix).

3. The apparatus for controlling temperature uniformity of claim 2,
    wherein the heat source-electricity converter calculates the amount of electricity by inputting data of a distribution of a heat source input from the heating controller in a linear model below.

$$\begin{bmatrix} A_1 q_1^{i+1} \\ A_2 q_2^{i+1} \\ \vdots \\ A_M q_M^{i+1} \end{bmatrix} = \begin{bmatrix} \lambda_1 Q_1^{i+1} \\ \lambda_2 Q_2^{i+1} \\ \vdots \\ \lambda_M Q_M^{i+1} \end{bmatrix}$$

(M: the number of heaters, $A_i$(i=1, ..., M): heated area of each heater, $Q_i$(i=1, ..., M): an amount of electricity input in a heater, $\lambda_i$(i=1, ..., M): a compensation coefficient).

4. The apparatus for controlling temperature uniformity of claim 3,
    wherein the heat source-electricity converter accumulates data of the measured temperature vector and the estimated temperature vector and corrects the compensation coefficient when a least squares error that is calculated by accumulated data exceeds a predetermined range.

5. The apparatus for controlling temperature uniformity of claim 1,
    wherein the heating controller estimates an entire temperature distribution based on the temperature data and presents the distribution of a heat source based on the entire temperature distribution.

6. A method for controlling temperature uniformity, comprising:
    a generating operation to generate temperature data of a substrate;
    a presenting operation to present a distribution of a heat source based on the temperature data;
    a calculating operation to calculate an amount of electricity to generate a heat source based on the distribution of a heat source; and
    a supplying operation to supply the calculated amount of electricity to a heater generating the heat source, wherein the calculating operation calculates the amount of electricity based on a loss of a thermal energy occurring in a heat transfer process from the heater to the substrate and the distribution of a heat source from the heating controller.

7. The method for controlling temperature uniformity of claim 6,
wherein the distribution of a heat source is generated by using a numerical model below.

$$\Delta t = t^{i+1} - t^i$$

$$\Delta q^{i+1} [(X^{i+1})^T (X^{i+1}) + \alpha I]^{-1} (X^{i+1})^T (V^{i+1} - \overline{Y}^{i+1})$$

$$q^{i+1} = q^i + \Delta q^{i+1}$$

$$\hat{Y}^{i+1} = Y^i + X^{i+1} \Delta q^{i+1}$$

($t^i$: present time, $t^{i+1}$: future time, $\Delta t$: interval of measurement, $q^{i+1}$: future heat source vector for controlling, $V^{i+1}$: target temperature vector, $Y^i$: measured temperature vector, $\hat{Y}^{i+1}$: estimated temperature vector for future, $\overline{Y}^{i+1}$: virtual temperature vector when $Y^i$ is constantly heated by $q^i$, $\alpha$: parameter for adjusting stability against noises of measured temperature, $X^{i+1}$: sensitivity coefficient matrix).

8. The method for controlling temperature uniformity of claim 7,
wherein the amount of electricity is calculated by inputting data of the distribution of a heat source in a linear model below.

$$\begin{bmatrix} A_1 q_1^{i+1} \\ A_2 q_2^{i+1} \\ \vdots \\ A_M q_M^{i+1} \end{bmatrix} = \begin{bmatrix} \lambda_1 Q_1^{i+1} \\ \lambda_2 Q_2^{i+1} \\ \vdots \\ \lambda_M Q_M^{i+1} \end{bmatrix}$$

(M: the number of heaters, $A_i$ (i=1, ..., M): heated area of each heater, $Q_i$ (i=1, ..., M): an amount of electricity input in a heater, $\lambda_i$ (i=1, ..., M): a compensation coefficient).

9. The method for controlling temperature uniformity of claim 8, further comprising:
an accumulating operation to accumulate data of the measured temperature vector and the estimated temperature vector; and
a correcting operation to correct the compensation coefficient when a least squares error calculated by accumulated data exceeds a predetermined range.

10. The method for controlling temperature uniformity of claim 6, further comprising:
an estimating operation to estimate an entire temperature distribution of the substrate based on the temperature data,
wherein the presenting operation to present the distribution of a heat source generates the distribution of a heat source based on the estimated and entire temperature distribution.

11. The method for controlling temperature uniformity of claim 10,
wherein the estimating operation comprises,
a building operation to build a numerical model for a form and a thermal behavior of the substrate;
a setting operation to set a regularization parameter to adjust a measured temperature of the substrate;
a generating operation to generate a sensitivity coefficient matrix that estimates a heat source received by the substrate from a plurality of heaters;
a condensing operation to condense the sensitivity coefficient matrix based on a power ratio input in the heaters respectively; and
an estimating operation to estimate an entire temperature distribution of the substrate based on the numerical model, the regularization parameter, and the condensed sensitivity coefficient matrix, when predetermined temperature data are input.

* * * * *